United States Patent [19]
Kamei

[11] Patent Number: 5,093,278
[45] Date of Patent: Mar. 3, 1992

[54] METHOD OF MANUFACTURING A SEMICONDUCTOR LASER

[75] Inventor: Hidenori Kamei, Yokohama, Japan

[73] Assignee: Sumitomo Electric Industries, Ltd., Osaka, Japan

[21] Appl. No.: 586,226

[22] Filed: Sep. 21, 1990

[30] Foreign Application Priority Data

Sep. 27, 1989 [JP] Japan .................. 1-251079

[51] Int. Cl.$^5$ .............................................. H01L 33/00
[52] U.S. Cl. ................................. 437/129; 156/611;
156/647; 156/649; 372/46; 437/90; 437/105;
437/133; 437/936; 148/DIG. 26; 148/DIG. 51;
148/DIG. 95; 148/DIG. 119; 148/DIG. 169
[58] Field of Search ............... 148/DIG. 15, 26, 25,
148/50, 51, 56, 65, 72, 95, 110, 119, 169, 33,
33.2, 33.5; 156/610–614, 647, 649, 650–652;
372/43, 46, 48; 437/81, 89, 90, 99, 105, 107,
108, 111, 126, 129, 133, 936, 939, 981

[56] References Cited

U.S. PATENT DOCUMENTS

| | | | |
|---|---|---|---|
| 4,354,898 | 10/1982 | Coldren et al. | 437/225 |
| 4,366,569 | 12/1982 | Hirao et al. | 437/129 |
| 4,496,403 | 1/1985 | Turley | 437/129 |
| 4,542,511 | 9/1985 | Goodfellow et al. | 372/46 |
| 4,573,255 | 3/1986 | Gordon et al. | 437/129 |
| 4,660,208 | 4/1987 | Johnston, Jr. et al. | 437/129 |
| 4,701,927 | 10/1987 | Naka et al. | 372/46 |
| 4,835,117 | 5/1989 | Ohba et al. | 437/129 |
| 4,852,110 | 7/1989 | Fujii et al. | 372/44 |
| 4,852,111 | 7/1989 | Hayakawa et al. | 372/46 |
| 4,864,581 | 9/1989 | Nelson et al. | 372/46 |
| 4,905,057 | 2/1990 | Ohishi et al. | 357/17 |
| 4,984,244 | 1/1991 | Yamamoto et al. | 372/45 |

FOREIGN PATENT DOCUMENTS 0127392 7/1983 Japan .

OTHER PUBLICATIONS

Parker, *The Technology and Physics of Molecular Beam Epitaxy*, Plenum Press, New York, 1985, pp. 542–547.
Metalorganic Chemical Vapor Deposition of InGaAsP/InP Layers and Fabrication of 1.3-$\mu$m Planar Buried Heterostructure Lasers. Kawabata, T.; Ishiguro, H.; and Koike S., *Journal of Applied Physics*, vol. 64 (1988) pp. 3684–3688.
Planar Selective Growth of InP by MOVPE, Nakai, K.; Sanada, T.; and Yamakoshi S., *Journal of Crystal Growth*, vol. 93 (1988) pp. 248–253.

Primary Examiner—Robert Kunemund
Attorney, Agent, or Firm—Beveridge, DeGrandi & Weilacher

[57] ABSTRACT

According to this invention, a first cladding layer of a first conductivity type, an active layer, a second cladding layer of a second conductivity type, and a cap layer much more susceptible to side etching than the second cladding layer susceptible to side etching than the second cladding layer are sequentially grown on a (100) crystal plane of a semiconductor substrate of the first conductivity type, and a stripe-like mask extending in a <011> direction is formed on the grown substrate with respect to each layer of the stacked substrate. This etching is performed in a crystal orientation for forming a reverse triangular mesa. However, since the cap layer is made of a material susceptible to side etching, a rounded mesa is formed. Thereafter, when a burying layer is formed on the etched portion by a vapor phase epitaxy method, the burying layer can be made to have a flat surface depending on crystal orientations.

8 Claims, 5 Drawing Sheets (PRIOR ART)

METHOD OF MANUFACTURING A SEMICONDUCTOR LASER

BACKGROUND OF THE INVENTION

1. Field of the Invention

The present invention relates to a method of manufacturing a semiconductor laser and, more particularly, a buried semiconductor laser.

2. Description of the Related Art

Compared with a liquid phase epitaxy method, a vapor phase epitaxy (VPE) method, especially an organometallic vapor phase epitaxy (OMVPE) method, has the following advantages:

(1) the VPE method can be applied to a large wafer, (2) the VPE method has good controllability of the thickness of a layer, and (3) the VPE method requires a short time in the growth process as a whole. Therefore, the VPE method has been employed to form a burying layer of a semiconductor laser. As a method of manufacturing a buried semiconductor laser (especially an InP long-wavelength laser) by an OMVPE method or the like, the following methods are proposed.

That is, as shown in FIG. 1A, a reverse triangular mesa 23 is formed using a stripe-like mask 22 formed on an InP cladding layer 21 as an etching mask, and, as shown in FIG. 1B, the reverse triangular mesa 23 is buried by a burying layer 24 using a VPE method. This method is disclosed in the Journal of Applied Physics vol. 64 (1988) pp.3884–3088.

In another related art, as shown in FIG. 2A, a rectangular mesa 31 is formed, and, as shown in FIG. 2B, the rectangular mesa 81 is buried by a VPE method. This method is disclosed in the Journal of Applied Physics vol. 64 (1988) pp.3684–3688, or the Journal of Crystal Growth vol. 93 (1988) pp.248–253.

In still another related art, a mesa is formed, and this mesa is buried by an VPE method, as shown in FIG. 3. This method is disclosed in the Journal of Applied Physics vol. 64 (1988) pp.3684–3688.

According to the first related art, as shown in FIG. 1B, nongrown portions (grooves) 25 are easily formed in the burying layer 24 near the bottom of the reverse triangular mesa 23 due to a lack of material diffusion from the vapor.

When the second related art is employed, a nongrown portions (grooves) is formed less than the first related art. However, in the second related art, a height 32 of the mesa 31 and an undercut amount 33 under a mask 34 must be limited in a predetermined range. According to the above literature, the mesa height is less than 3 μm, and the undercut amount is about 1 μm when the mesa height is 2.5 μm.

According to the third related art for performing burying growth in a crystal orientation for forming a curved mesa, as shown in FIG. 3, a (111)A crystal plane is formed on a burying layer 41, and the burying layer 41 extends on the mask 42 along this crystal face. Therefore, the mesa cannot be buried in a flat surface.

SUMMARY OF THE INVENTION

It is an object of the present invention to solve the above problems. That is, it is an object of the present invention to provide a method of manufacturing a semiconductor laser, capable of forming a burying layer having a flat surface using an VPE method.

In order to achieve the object, there is provided a method of manufacturing a semiconductor laser comprising the steps of: sequentially growing a first cladding layer of a first conductivity type, an active layer, a second cladding layer of a second conductivity type, and a cap layer much more susceptible to side etching than the second cladding layer on a (100) crystal plane of a semiconductor substrate of the first conductivity type; forming a stripe-like mask extending in a <011> direction on the multi-layered substrate; using the mask as an anti-etching material and etching the multi-layered substrate from a surface thereof to reach the first cladding layer by using an etchant which essentially has a smaller etching rate on a (111)B crystal plane than on other crystal planes of the multi-layered substrate; forming a burying layer by a VPE method on a region from which the multi-layered substrate is removed by the etching step, using the mask as a selective growth mask; and removing the mask and the cap layer and growing a third cladding layer of the second conductivity type and a contact layer of the second conductivity type on the surface of the substrate.

The direction of the mask formed on the cap layer is a direction for easily forming a reverse triangular mesa in the next etching step. However, since the cap layer is made of a material susceptible to side etching, namely, the material with a larger etching rate in the (111)B plane than that of the second cladding layer, a rounded mesa which is tapered upward is formed. For this reason, in the next burying step, a nongrown portion is not formed at the proximal end of the mesa. In addition, unlike in a case wherein burying growth is performed in a crystal orientation for forming a rounded mesa, a (111)A crystal plane is not formed. Therefore, abnormal growth on the mask does not occur, and a burying layer having a flat surface is formed.

The present invention will become more fully understood from the detailed description given hereinbelow and the accompanying drawings which are given by way of illustration only, and thus are not to be considered as limiting the present invention.

Further the scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DETAILED DESCRIPTION OF THE PREFERRED EMBODIMENT

Figure 1A:
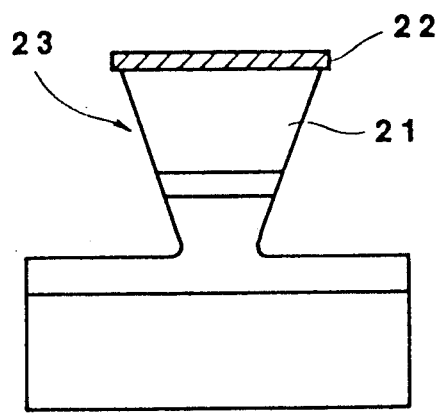
FIGS. 1A, 1B, 2A, 2B and 3 are sectional views showing prior art devices, respectively.
Figure 1B:
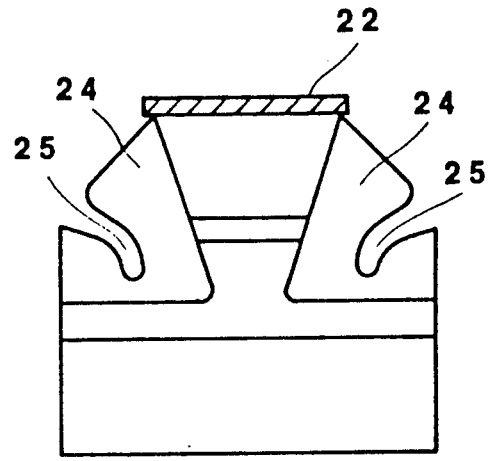
Figure 2A:
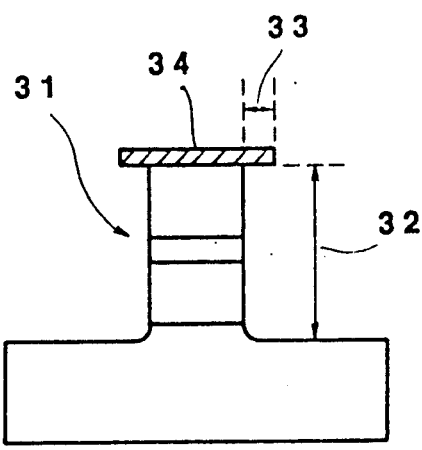
Figure 2B:
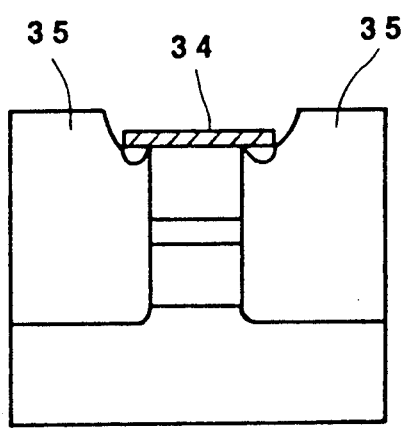
Figure 3:
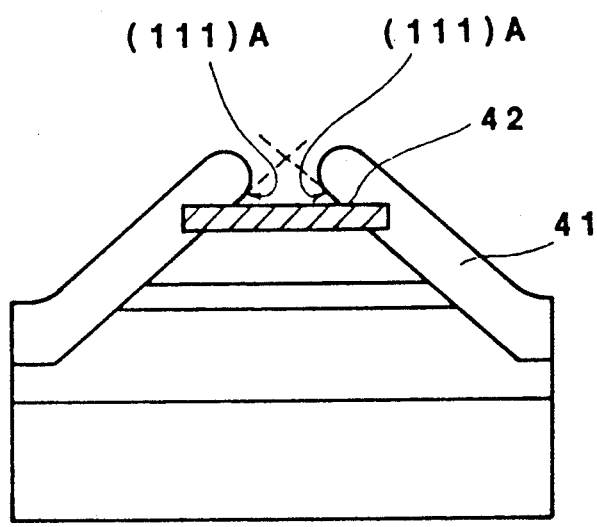
Figure 4A:
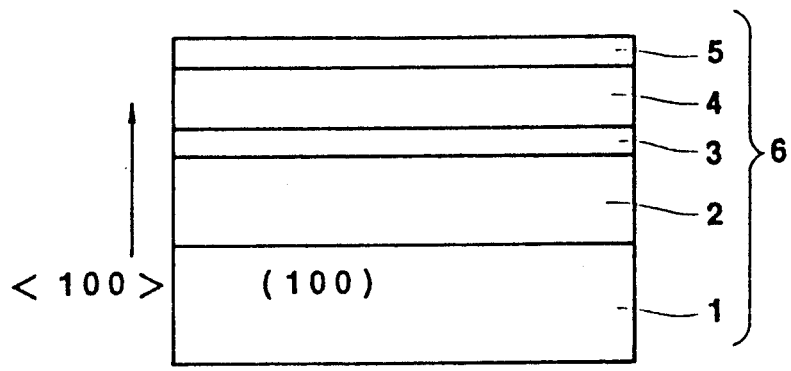
FIGS. 4A to 4E are sectional views showing the steps in manufacturing a semiconductor laser according to the first embodiment of the present invention.

An n-type Si-doped InP first cladding layer 2, an undoped GaInAsP active layer 3, a p-type Zn-doped InP second cladding layer 4, and a p-type Zn-doped GaInAs cap layer 5 are sequentially grown on an n-type Sn-doped InP (100) substrate 1 by a low-pressure organometallic vapor phase epitaxy method (low-pressure OMVPE method) to form a multi-layered substrate 6 (refer to FIG. 4A). Each thickness of the above layers is set as follows. The n-type InP first cladding layer has a thickness of 1 μm, the undoped GaInAsP active layer 3 has a thickness of 0.15 μm, the p-type InP second cladding layer 4 has a thickness of 0.4 μm, and the pl-type GaInAs cap layer 5 has a thickness of 0.2 μm.

Figure 4B:
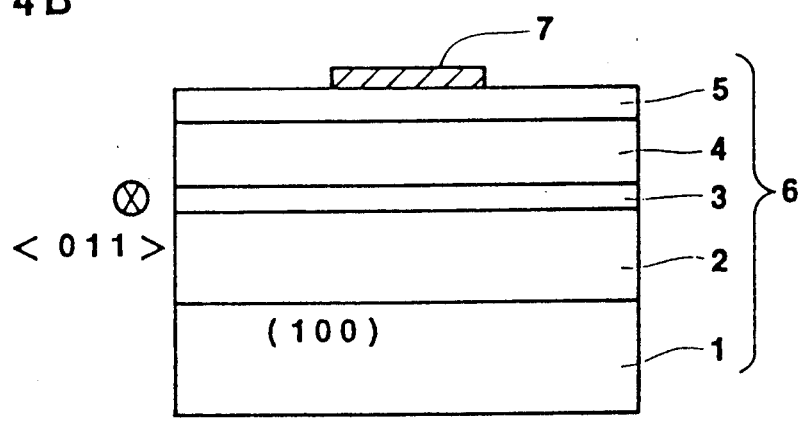

An SiO$_2$ film is deposited on the multi-layered substrate 6 by a thermal chemical vapor deposition method (thermal CVD method). The SiO$_2$ film is coated with a resist film, and a stripe pattern of the resist film having a width of 6 μm is formed in a <011> direction (a direction perpendicular to the drawing surface), i.e., a direction for forming a reverse triangular mesa. The SiO$_2$ film is selectively etched by buffered hydrofluoric acid using the resist film as a mask to form a stripe SiO$_2$ film 7, and the remaining resist film is removed (FIG. 4B). At this time, the width of the stripe SiO$_2$ film 7 is slightly narrowed by side etching to be about 5 μm.

Figure 4C:
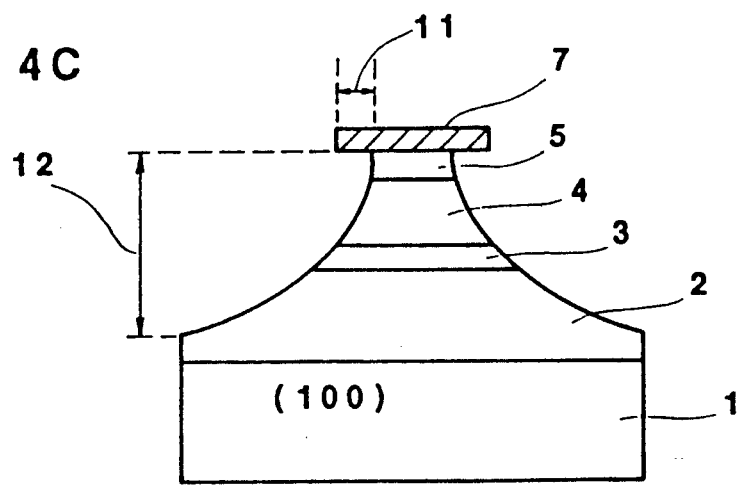

The layers 2 to 5 are selectively etched using the stripe SiO$_2$ film 7 as a mask by an etchant (a volume ratio of Br$_2$:methanol=2.5:1000) made of Br-methanol sufficiently cooled with ice water to be about 0° C. this etching is performed for about 5 minutes while the etchant is churned, thereby forming a mesa having a depth 12 of about 2.5 μm and a side etching amount (undercut amount) 11 of about 1.7 μm (refer to FIG. 4C). According to an experiment performed by the present inventor, when the Br-methanol etchant (a volume ratio of Br$_2$:methanol=2.5:1000) is used, an undercut amount of 0.5 to 0.7 per etching depth of 1 can be obtained. Although a crystal orientation is conventionally used to form a reverse triangular mesa in etching using the Br-methanol etchant, a rounded mesa tapered upward shown in FIG. 4C can be obtained. This is because the cap layer 5 susceptible to side etching by the Br-methanol etchant is formed immediately below the stripe SiO$_2$ film 7 for selective etching. Note that the active layer 3 according to this embodiment has a width of 1.5 μm at which fundamental transverse mode oscillation can be performed.

Figure 4D:
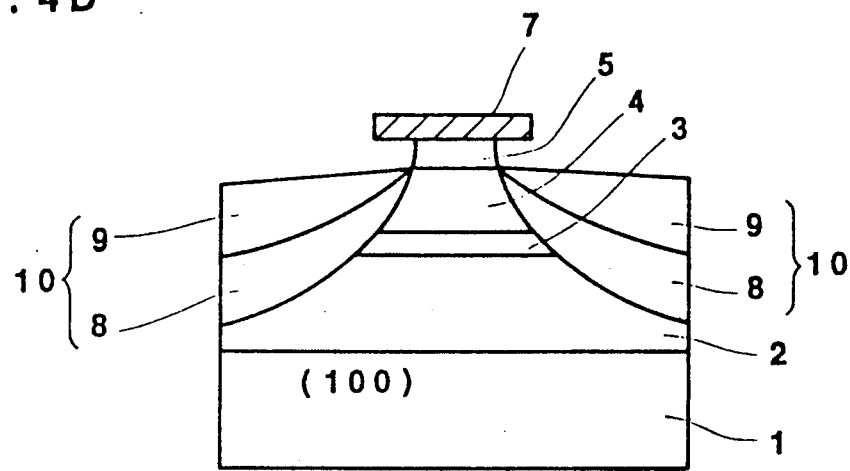

A multi-burying layer 10 consisting of a p-type Zn-doped InP layer (thickness: about 1 μm) 8 and an n-type Si-doped InP layer (thickness: about 1 μm) 9 is grown by a low-pressure OMVPE method using the stripe SiO$_2$ film 7 as a selective growth mask (FIG. 4D). The InP layers 8 and 9 constituting the burying layer 10 are gradually thin from the lower portion of the mesa to the upper portion thereof, and the burying layer 10 can be formed such that its surface is almost parallel to the surface of the substrate 1. In addition, the burying layer 10 is a two-layered structure always having a correct deposition order at any place on the mesa side surface. Therefore, a pnpn structure (thyristor) is properly formed on the entire outer surface of the mesa by a third cladding layer 13 to be formed later, burying InP layers 9 and 8, and the first cladding layer 2, and the p-type InP layer 8 and the n-type InP layer 9 can serve as current blocking layers. In addition, since the p-type InP layer B is gradually made thin toward the upper portion of the mesa on the mesa side surfaces, a path for a leakage current flowing from the second cladding layer 4 to the first cladding layer 2 through the p-type InP layer B is narrow. Therefore, a structure for effectively reducing leakage current can be obtained.

The present inventor confirmed that, in the burying growth, no limitations were imposed on the mesa depth for burying the grooves to obtain flat surface. In addition, the present inventor also confirmed that, in this burying growth, the burying layer 10 did not grow on the side surfaces of the cap layer (GaInAs) 5 immediately below the mask 7. For this reason, even when the burying growth is advanced, a vapor region can be sufficiently left on an undercut portion below the stripe SiO$_2$ film 7, and a lack of material diffusion can be prevented.

Figure 5A:
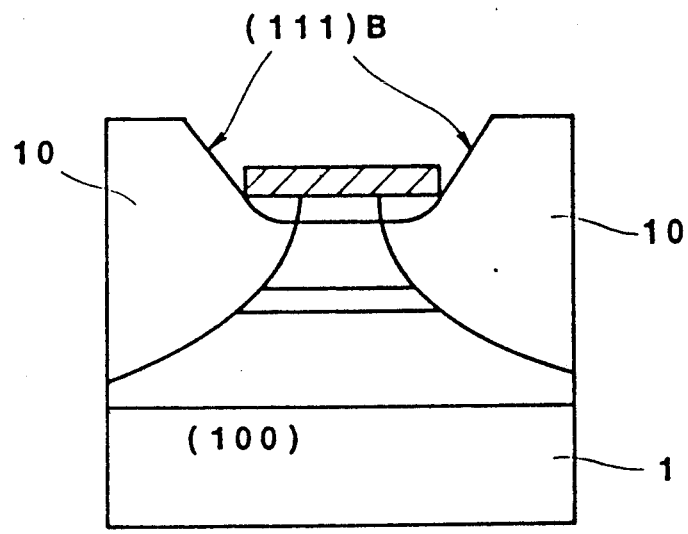
FIGS. 5A and 5B are sectional views for explaining an optimal height of a burying layer.
Figure 5B:
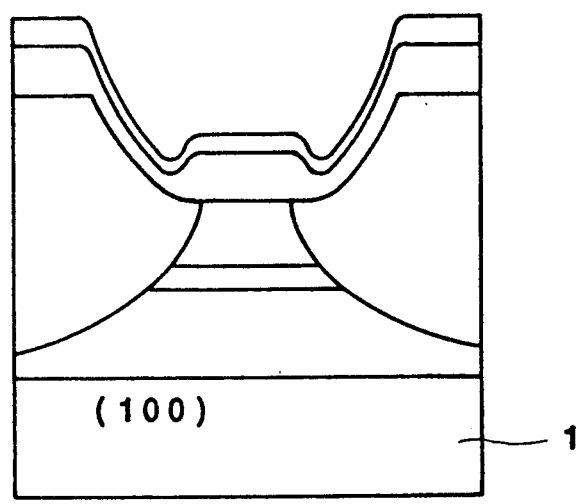

In the burying growth, it is important that the height of the surface of the burying layer lo does not exceed that of the stripe SiO$_2$ film 7 in order to flatten the surfaces of a third cladding layer and a contact layer formed in the subsequent steps. That is, when the surface height of the burying layer 10 largely exceeds that of the stripe SiO$_2$ film 7, as shown in FIG. 5A, a (111)B crystal plane is formed on the burying layer 10 Since the growth rate of the third cladding layer and the contact layer are smaller in the (111)B crystal plane than in other crystal planes, as shown in FIG. 5B, a W-shaped groove is formed on the layers not to flatten the layers. In other words, when the surface of the burying layer 10 exceeds the surface of the stripe SiO$_2$ film 7 in height such that the (111)B crystal plane is not formed, the growth of the third cladding layer and the contact layer is not adversely affected. The W-shaped groove causes defective products and degradation of reliability. Especially since the contact layer on the (111)B crystal plane is thin, a contact resistance of the resultant device is increased, thereby causing degradation of the characteristics of the resultant device.

Figure 4E:
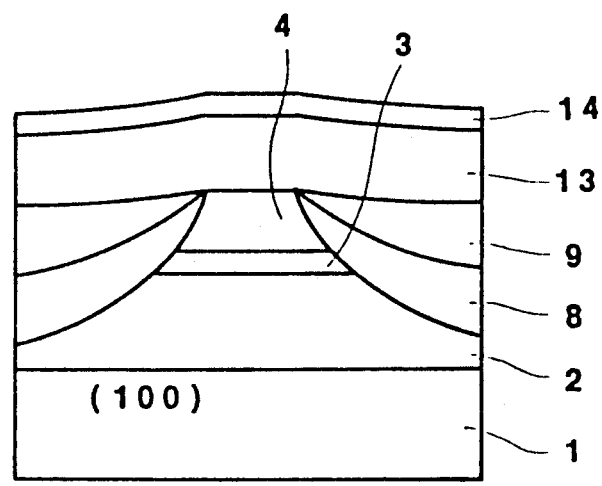

Finally, the stripe SiO$_2$ film 7 is removed using buffered hydrofluoric acid, and the cap layer 5 is removed using an etchant consisting of phosphoric acid: hydrogen peroxide=5:1. Thereafter, a p-type Zn-doped InP third cladding layer (thickness: about 1.5 μm) 13 and a p-type Zn-doped GaInAs contact layer (thickness: about 0.5 μm)) 14 are sequentially grown by a low-pressure OMVPE method (FIG. 4E).

Note that, in this embodiment, the burying layer 10 may have a two-layered structure consisting of layers having different conductivity types, and a block layer using a p-n junction is formed by this structure. However, a high-resistance layer or a multi-layered structure including a high-resistance layer may be used as the burying layer 10 to constitute the block layer using a resistor.

The conductivity types of the InP substrate 1, the first to third cladding layers, and the contact layer may be reversed. In this case, the burying layer 10 has a structure formed by stacking a p-type InP layer, an n-type InP layer, and a p-type InP layer, or a structure including a high-resistance layer.

The cap layer is not limited to the GaInAs layer. The cap layer may be made of $Ga_xIn_{1-x}As_yP_{1-y}$ ($0.6 \leq y < 1$, $x \approx 0.47y$).

In this embodiment, a Br-methanol etchant is used, the temperature of the etchant is about 0° C., and the concentration of Br is 0.25%. According to experiments performed by the present inventor, it is confirmed that, when the temperature falls within a range of 0° C. to 80° C. and the concentration of Br falls within a range of 0.1% to 5%, etching can be performed to substantially form a rounded mesa as in this embodiment. As the temperature is decreased, the reaction is slowed, thus obtaining good controllability.

An etchant used in the present invention is not limited to a Br-methanol etchant. That is, this etchant may be an etchant for causing changes in etching rates of cladding layers 2 and 4 and an active layer 3, depending on their crystal faces. Practically, this etchant may be another alcohol solution of a halogen, e.g., an $I_2$ methanol etchant.

From the invention thus described, it will be obvious that the invention may be varied in many ways. Such variations are not to be regarded as a departure from the spirit and scope of the invention, and all such modifications as would be obvious to one skilled in the art are intended to be included within the scope of the following claims.

I claim:

1. A method of manufacturing a semiconductor laser, said method comprising the steps of:

sequentially forming a first cladding layer having a first conductivity type, an active layer, a second cladding layer having a second conductivity type and a cap layer on a (100) plane of a semiconductor substrate having said first conductivity type to form a laminated structure for a semiconductor laser;

forming a stripe-like mask made of an inorganic material and extending in a <011> direction with respect to said semiconductor substrate, etching said laminated structure from a surface thereof to said first cladding layer by using said mask as a direct anti-etching mask with a predetermined etchant, said predetermined etchant being selected so that etching rates of said cap layer and said second cladding layer on a (111)B plane are respectively lower than those of other crystal planes of said cap layer and said second cladding layer, said etchant etching said cap layer at a higher etching rate on the (111)B plane thereof than said second cladding layer on the (111)B plane thereof;

forming a burying layer by an epitaxial growing method in a region from which said laminated structure has been removed by said etching step, using said mask as a selective growing mask;

moving said mask and said cap layer; and forming a third cladding layer of said second conductivity type and a contact layer of said second conductivity type on said burying layer and said second cladding layer.

2. A method according to claim 1, wherein a growing method for growing said burying layer is an organometallic vapor phase epitaxy method.

3. A method according to claim 2, wherein said substrate and said first and second cladding layers are made of InP, and said cap layer is made of $Ga_xIn_{x-1}As_yP_{y-1}$ ($0.6 \leq y \leq 1$, $x \approx 0.47y$).

4. A method according to claim 3, wherein an etchant used in said etching step is a halogen alcohol solution.

5. A method according to claim 4, wherein said halogen alcohol solution is a Br-methanol solution.

6. A method according to claim 1, wherein said mask is made of silica.

7. A method according to claim 1, wherein said burying layer is formed to be lower than a mask surface of said stripe-like mask in a height direction from said substrate.

8. A method according to claim 1, wherein in said etching step, said cap layer is side-etched such that the width of said cap layer becomes smaller than that of said mask.

* * * * *